(12) United States Patent
Miyakoshi

(10) Patent No.: US 9,691,692 B2
(45) Date of Patent: Jun. 27, 2017

(54) SEMICONDUCTOR DEVICE

(71) Applicant: FUJI ELECTRIC CO., LTD., Kawasaki-shi (JP)

(72) Inventor: Masaoki Miyakoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/150,828

(22) Filed: May 10, 2016

(65) Prior Publication Data

US 2016/0365307 A1 Dec. 15, 2016

(30) Foreign Application Priority Data

Jun. 10, 2015 (JP) ................................ 2015-117171

(51) Int. Cl.
*H01L 25/07* (2006.01)
*H01L 23/498* (2006.01)
(Continued)

(52) U.S. Cl.
CPC ........ *H01L 23/49811* (2013.01); *H01L 24/32* (2013.01); *H01L 25/072* (2013.01); *H01L 25/18* (2013.01); *H01L 23/3121* (2013.01); *H01L 23/3735* (2013.01); *H01L 23/49833* (2013.01); *H01L 2224/29139* (2013.01); *H01L 2224/32225* (2013.01); *H01L 2924/014* (2013.01); *H01L 2924/0105* (2013.01); *H01L 2924/01029* (2013.01); *H01L 2924/01047* (2013.01); *H01L 2924/01049* (2013.01); *H01L 2924/01051* (2013.01); *H01L 2924/01083* (2013.01);
(Continued)

(58) Field of Classification Search
CPC .......... H01L 23/49833; H01L 23/3735; H01L 23/4334; H01L 24/81; H01L 24/16; H01L 24/13; H01L 23/49811; H01L 25/072
See application file for complete search history.

(56) References Cited

U.S. PATENT DOCUMENTS 4,245,273 A * 1/1981 Feinberg ............. H01L 23/4338
257/714
4,806,111 A * 2/1989 Nishi ..................... H01R 4/028
439/109
(Continued)

FOREIGN PATENT DOCUMENTS

JP 6-283838 10/1994
JP 2012-89893 5/2012
(Continued)

*Primary Examiner* — Jarrett Stark

(57) ABSTRACT

A semiconductor device in which the electrical connection is established using conductive pins and a printed wiring board, wherein the printed wiring board is mounted parallel to an insulated circuit board to prevent poor bonding of the conductive pins. A third-type conductive pin is arranged in such a manner as to be connected to a first metal layer at a position farther than a first-type conductive pin arranged at a position farthest from a side that is in contact with a gap between island regions. Similarly, another third-type conductive pin is arranged in such a manner as to be connected to another first metal layer at a position farther than another first-type conductive pin arranged at a position farthest from another side that is in contact with the gap between the island regions.

10 Claims, 6 Drawing Sheets

(51) Int. Cl.
  *H01L 23/00*   (2006.01)
  *H01L 25/18*   (2006.01)
  *H01L 23/31*   (2006.01)
  *H01L 23/373*   (2006.01)

(52) U.S. Cl.
  CPC ............... *H01L 2924/05032* (2013.01); *H01L 2924/05042* (2013.01); *H01L 2924/05432* (2013.01); *H01L 2924/10253* (2013.01); *H01L 2924/1203* (2013.01); *H01L 2924/12032* (2013.01); *H01L 2924/13055* (2013.01); *H01L 2924/13091* (2013.01); *H01L 2924/15747* (2013.01)

(56) References Cited

U.S. PATENT DOCUMENTS

| | | | | |
|---|---|---|---|---|
| 4,816,426 | A * | 3/1989 | Bridges | H01L 21/486 174/521 |
| 4,965,227 | A * | 10/1990 | Chang | H01L 21/486 174/50.51 |
| 5,097,318 | A * | 3/1992 | Tanaka | H01L 23/057 257/690 |
| 5,299,097 | A * | 3/1994 | Kondo | H01L 23/4334 257/666 |
| 5,952,909 | A * | 9/1999 | Umeno | H01F 17/0013 29/602.1 |
| 6,121,553 | A * | 9/2000 | Shinada | H01L 23/49894 174/255 |
| 6,326,561 | B1 * | 12/2001 | Watanabe | H01L 21/486 174/260 |
| 6,372,119 | B1 * | 4/2002 | Ray | C25D 3/562 205/255 |
| 8,304,882 | B2 * | 11/2012 | Oka | H01L 21/565 257/687 |
| 8,436,459 | B2 * | 5/2013 | Oka | H01L 23/3735 257/691 |
| 2002/0127418 | A1 * | 9/2002 | Takeuchi | H05K 1/185 428/457 |
| 2004/0041201 | A1 * | 3/2004 | Sugiyama | H01L 23/49844 257/316 |
| 2004/0195092 | A1 * | 10/2004 | D'Astolfo, Jr. | C25C 3/12 204/280 |
| 2007/0215903 | A1 | 9/2007 | Sakamoto et al. | |
| 2010/0007026 | A1 * | 1/2010 | Shikano | H01L 24/49 257/773 |
| 2010/0013085 | A1 * | 1/2010 | Oi | H01L 23/3121 257/693 |
| 2010/0133681 | A1 * | 6/2010 | Oka | H01L 23/041 257/693 |
| 2011/0080714 | A1 * | 4/2011 | Tsukada | H01L 23/142 361/774 |
| 2013/0307146 | A1 * | 11/2013 | Osumi | H01L 23/49811 257/737 |
| 2014/0069989 | A1 * | 3/2014 | Masumoto | H01L 21/50 228/180.22 |
| 2014/0246783 | A1 | 9/2014 | Nishizawa et al. | |

FOREIGN PATENT DOCUMENTS

| | | |
|---|---|---|
| JP | 2012119618 A * | 6/2012 |
| JP | 2013-125803 | 6/2013 |
| JP | 2013-125804 | 6/2013 |
| WO | WO 2014/185050 A1 | 11/2014 |

* cited by examiner

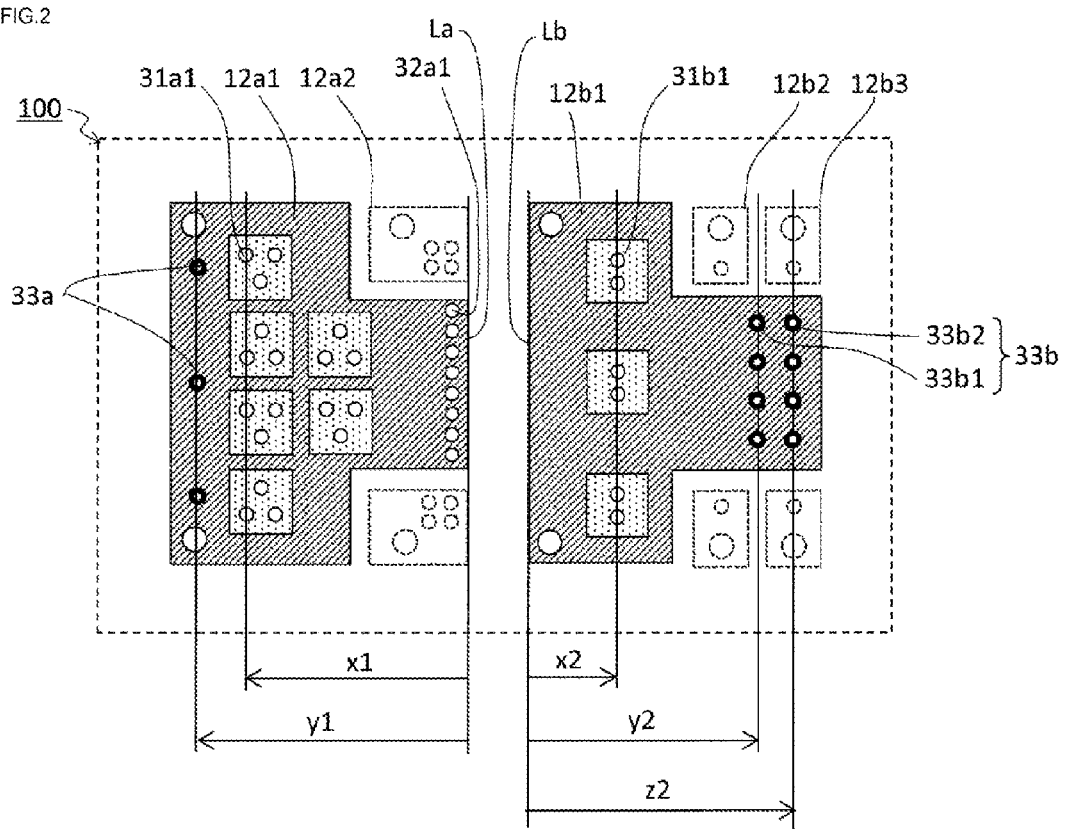

SEMICONDUCTOR DEVICE

CROSS-REFERENCE TO RELATED APPLICATIONS

This application is based on, and claims foreign priority to, Japanese Patent Application No. 2015-117171, filed Jun. 10, 2015, the content of which is incorporated herein by reference in its entirety.

BACKGROUND

1. Field

The present disclosure relates to a semiconductor device such as a power device or a switching IC for high frequency applications, and more particularly to a semiconductor device equipped with a power semiconductor element.

2. Related Art

Power semiconductor devices often use bonding wires or lead frames for the electrical connection between the semiconductor elements thereof. Power semiconductor devices, such as the ones disclosed in Japanese Unexamined Patent Application Publication No. 2013-125804 and WO 2014/185050, which provide excellent heat dissipation with conductive pins and a printed wiring board, have started to be used as well.

However, according to the mounting methods described in Japanese Unexamined Patent Application Publication No. 2013-125804 and WO 2014/185050, the printed wiring board is tilted, lifting the conductive pins, and consequently causing poor electrical connection. The causes thereof were unknown.

SUMMARY

An aspect of the present disclosure is to provide a semiconductor device in which the electrical connection is established using conductive pins and a printed wiring board, wherein the printed wiring board is mounted parallel to an insulated circuit board to prevent poor bonding of the conductive pins.

In order to achieve the foregoing aspect, a semiconductor device of the present disclosure has: an insulated circuit board having an insulating substrate, a first metal layer disposed on one of principal surfaces of the insulating substrate and divided into a plurality of island regions, and a second metal layer disposed on the other principal surface of the insulating substrate; a semiconductor element that is bonded to the first metal layer; a printed wiring board that is disposed to face the first metal layer and extends over the plurality of island regions; first-type conductive pins each having one end fixed to the printed wiring board and the other end soldered to a surface electrode of the semiconductor element; second-type conductive pins each having one end fixed to the printed wiring board and the other end soldered to the first metal layer; and third-type conductive pins each having one end fixed to the printed wiring board and the other end soldered to the first metal layer, the third-type conductive pins being provided independently from an electric circuit, wherein each of the third-type conductive pins is arranged in each of the island regions adjacent to each other in the printed wiring board in such a manner as to be connected to the first metal layer at the same position as, or a position farther than, the first-type conductive pin or the second-type conductive pin that is arranged at a position farthest from a side that is in contact with a gap between the island regions.

In the semiconductor device of the present disclosure, of the island regions in which the third-type conductive pins are to be arranged, it is preferred that more of the third-type conductive pins be arranged in an island region that has a lower total number of the connected first-type conductive pins and a lower total number of the connected second-type conductive pins.

According to embodiments of the present disclosure, each of the third-type conductive pins, provided independently from an electric circuit, is arranged at the same position as, or a position farther than, the first-type conductive pin or the second-type conductive pin that is arranged at a position farthest from the side that is in contact with the gap between the island regions. Therefore, the printed wiring board can be prevented from tilting, preventing poor bonding of the conductive pins and consequently improving the non-defective product ratio of the semiconductor device.

BRIEF DESCRIPTION OF THE DRAWINGS

These and/or other aspects and advantages will become apparent and more readily appreciated from the following description of the embodiments, taken in conjunction with the accompanying drawings of which:

FIG. 2 is a diagram for explaining the arrangement of third-type conductive pins of the semiconductor device shown in FIGS. 1A and 1B;

DESCRIPTION OF EMBODIMENTS

A comparative example of the semiconductor device according to the present disclosure is described first for the purpose of enabling easy understanding of the characteristics of the semiconductor device.

Comparative Example

Figure 5:
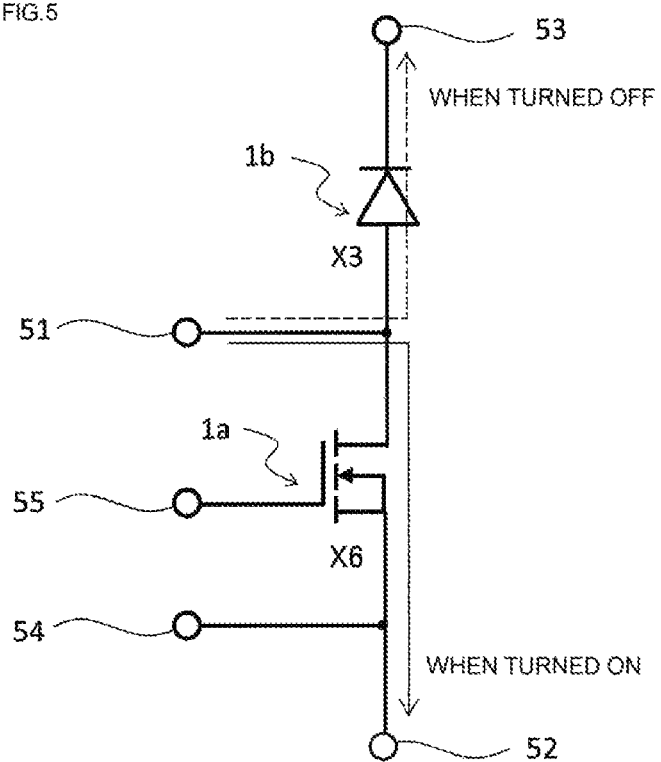
FIG. 5 is a diagram showing an equivalent circuit of a chopper control semiconductor device.

For example, a chopper control semiconductor device 200 can be configured by a MOS transistor 1a and a diode 1b that are connected in series, as shown by an equivalent circuit in FIG. 5. When the MOS transistor 1a is turned on by a control signal input to an external terminal 55, a current flows from an external terminal 51 to an external terminal 52, as shown by the solid arrow. When the MOS transistor 1a is turned off, the current flows from the external terminal 51 to an external terminal 53, as shown by the dashed arrow. The semiconductor device 200 is configured to be able to change the direction of the current alternately in this manner, and therefore can be used in, for example, an electric circuit for driving a motor.

Figure 6A:
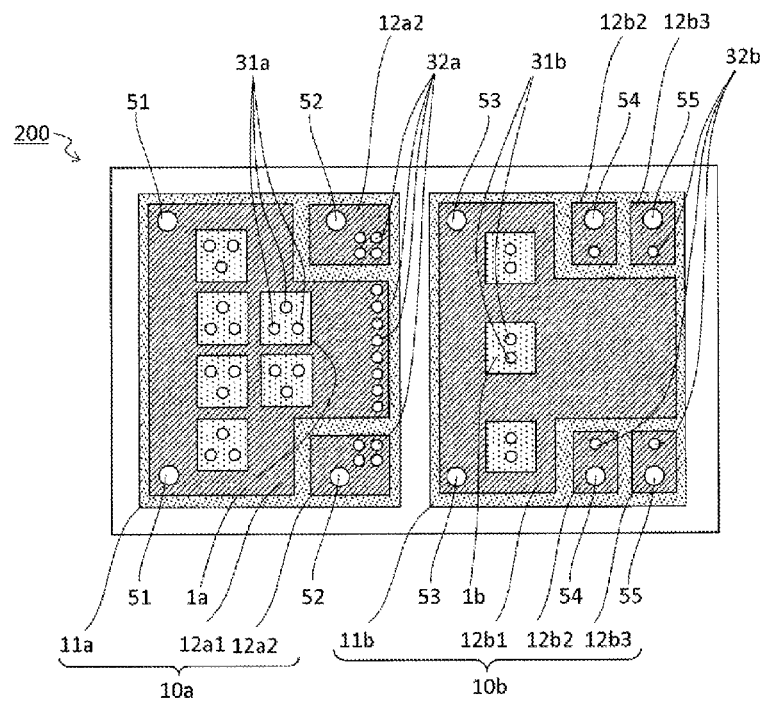
FIG. 6A is a diagram for explaining a mounting structure of a semiconductor device according to a comparative example.
Figure 6B:
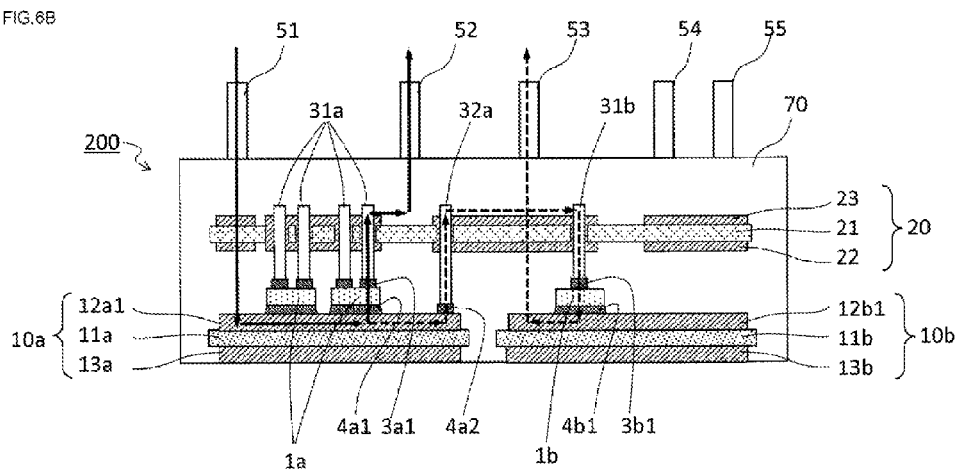
FIG. 6B is a cross-sectional diagram of FIG. 6A.

As shown in the plan view of FIG. 6A and the cross-sectional diagram FIG. 6B, the semiconductor device 200 has an insulated circuit board 10a to which are bonded six MOS transistors 1a that are connected in parallel for the purpose of increasing the current capacity, an insulated circuit board 10b to which are bonded three diodes 1b that are connected in parallel for the purpose of increasing the current capacity, a printed wiring board 20 (not shown in the plan view), conductive pins 31a that are fixed to the printed wiring board 20 and bonded to surface electrodes of the MOS transistors 1a, conductive pins 32a that are fixed to the printed wiring board 20 and bonded to surface metal layers 12a1, 12a2 of the insulated circuit board 10a, conductive pins 31b that are fixed to the printed wiring board 20 and bonded to surface electrodes of the diodes 1b, conductive pins 32b that are fixed to the printed wiring board 20 and bonded to surface metal layers 12b2, 12b3 of the insulated circuit board 10b, external terminals 51 through 55, and thermosetting sealing resin 70 such as epoxy resin.

The insulated circuit board 10a has an insulation board 11a, the metal layer 12a1, which is disposed on one of the principal surfaces of the insulation board 11a and to which the MOS transistors 1a are bonded with solder 4a1 therebetween, metal layers 12a2 (two) to each of which the external terminal 52 is soldered, and a metal layer 13a that is disposed on the other principal surface of the insulation board 11a and can be connected to a cooler that is not shown.

The insulated circuit board 10b has an insulation board 11b, a metal layer 12b1, which is disposed on one of the principal surfaces of the insulation board 11b and to which the diodes 1b are bonded with solder 4b1 therebetween, metal layers 12b2 (two) to each of which the external terminal 54 is soldered, metal layers 12b3 (two) to each of which the external terminal 55 is soldered, and a metal layer 13b that is disposed on the other principal surface of the insulation board 11b and can be connected to the cooler that is not shown.

The printed wiring board 20 is configured by an insulation board 21, a metal layer 22 that is positioned on one of the principal surfaces of the insulation board 21, faces the insulated circuit boards 10a and 10b and is wired into an electric circuit, and a metal layer 23 that is positioned on the other principal surface of the insulation board 21 and wired into an electric circuit, wherein the metal layers 22 and 23 are electrically connected to each other by via holes that pass through the printed wiring board 20 and have inner circumferential surfaces thereof conductively plated.

The conductive pins 31a, 31b, 32a are in a cylindrical or prismatic shape. The ends thereof at one side are press-fitted to the via holes provided in the printed wiring board 20, and fixed to the printed wiring board 20 using a bonding member so as to be unremovable, and the ends thereof at the other side are soldered to the MOS transistors 1a, the diodes 1b, and the metal layers 12a1, 12b1, 12a2, 12b2, 12b3 of the insulated circuit boards.

The external terminals 51 through 55 extend to the outside of the sealing resin 70 through through-holes or cutouts provided in the printed wiring board 20, in such a manner as to not come into contact with the printed wiring board 20.

In the semiconductor device 200, when the MOS transistors 1a are on, the current flows from the external terminal 51 to the external terminal 52 through the metal layer 12a1, solder 4a1, MOS transistors 1a, solder 3a1, and conductive pins 31a of the insulated circuit board 10a, the metal layers 22 and 23 of the printed wiring board 20, and the conductive pins 32a of the metal layers 12a2, as shown by the solid arrows. When the MOS transistors 1a are off, the current flows from the external terminal 51 to the external terminal 53 through the metal layer 12a1, solder 4a2 and conductive pins 32a of the insulated circuit board 10a, the metal layers 22 and 23 of the printed wiring board 20, the conductive pins 31b, solder 3b1, diode 1b, solder 4b1, and the metal layer 12b1 of the insulated circuit board 10b, as shown by the dashed arrows.

Figure 7:
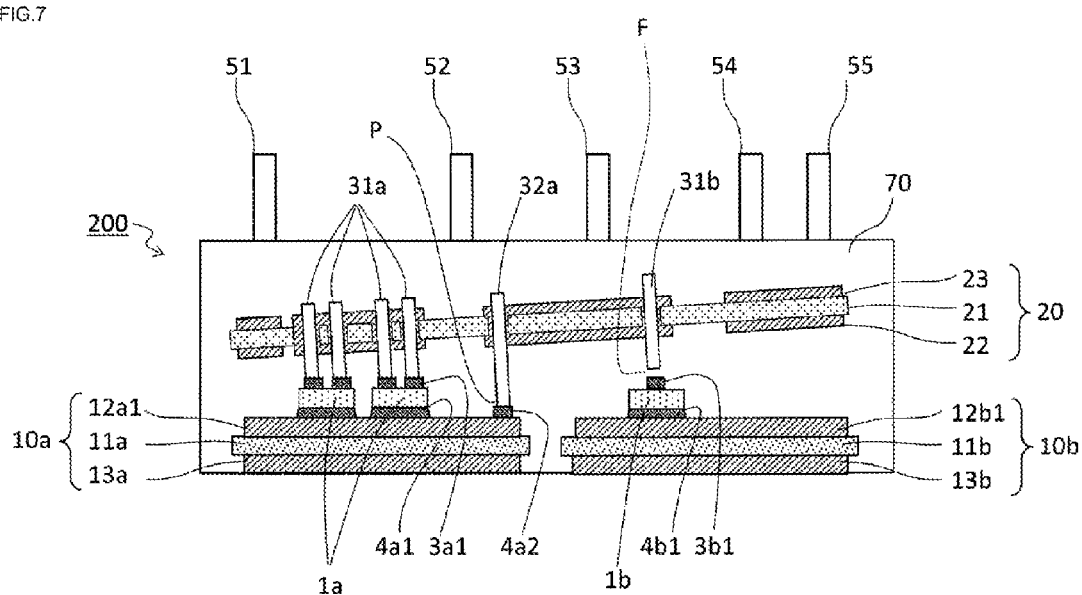
FIG. 7 is a diagram for explaining poor connection occurring in the semiconductor device according to the comparative example.

The semiconductor device 200 has a problem where the printed wiring board 20 tilts about a point P as a fulcrum and consequently the conductive pins 31b lift up, causing poor bonding F, as shown in FIG. 7.

The reasons are as follows. However, for illustrative purposes, the conductive pins soldered to the semiconductor element are referred to as "first-type conductive pins," and the conductive pins soldered to the metal layers on the insulated circuit boards are referred to as "second-type conductive pins."

First of all, the number of conductive pins arranged on the insulated circuit board 10a is counted. The metal layer 12a1 of the insulated circuit board 10a has six MOS transistors 1a, wherein each MOS transistor has two first-type conductive pins 31a as source electrodes and one first-type conductive pin 31a as a gate electrode. Therefore, a total of eighteen first-type conductive pins 31a are arranged on the metal layer 12a1 of the insulated circuit board 10a. The metal layer 12a1 also has eight second-type conductive pins 32a arranged along the gap between the metal layer 12a1 and the metal layer 12b1. There are two metal layers 12a2 to each of which the external terminal 52 is soldered, and four second-type conductive pins 32a are bonded to each of these metal layers 12a2. Therefore, a total of eight second-type conductive pins 32a are arranged on these metal layers. Thus, a total of thirty-four conductive pins are arranged on the insulated circuit board 10a.

Next, the number of conductive pins arranged on the insulated circuit board 10b is counted. The metal layer 12b1 of the insulated circuit board 10b has three diodes 1b, wherein each diode has two first-type conductive pins 31b bonded thereto as anode electrodes. Therefore, a total of six first-type conductive pins 31b are arranged on the metal layer 12b1. There are two metal layers 12b2 to each of which the external terminal 54 is soldered, and one second-type conductive pin 32a is bonded to each of these metal layers 12b2. Therefore, a total of two second-type conductive pins 32a are arranged on these metal layers. In addition, there are two metal layers 12b3 to each of which the external terminal 55 is soldered, and one second-type conductive pin 32a is bonded to each of these metal layers 12b3. Therefore, a total of two second-type conductive pins 32a are arranged on these metal layers. Thus, a total of ten conductive pins are arranged on the insulated circuit board 10b.

As described above, the insulated circuit board 10a has thirty-four conductive pins and the insulated circuit board 10b has ten, and the numbers of conductive pins are not balanced at all between these insulated circuit boards. Moreover, in order to lower the wiring resistance by connecting the insulated circuit board 10a and the insulated circuit board 10b at the shortest distance, the second-type conductive pins 32a are grouped together at a side of the insulated circuit board 10a that is close to the insulated circuit board 10b, whereby the printed wiring board tilts easily about this side as in a seesaw.

A cause of the poor bonding F is as follows: when a solder paste for bonding the conductive pins is caused to reflow in order to mount the printed wiring board 20 having the conductive pins fixed thereto, the surface tension of the melted solder strongly pulls the printed wiring board 20 down at the insulated circuit board 10a having more conductive pins and lifts the printed wiring board 20 at the insulated circuit board 10b having less conductive pins.

First Embodiment

The present disclosure solves the foregoing problem by configuring the semiconductor device thereof as follows.

Figure 1A:
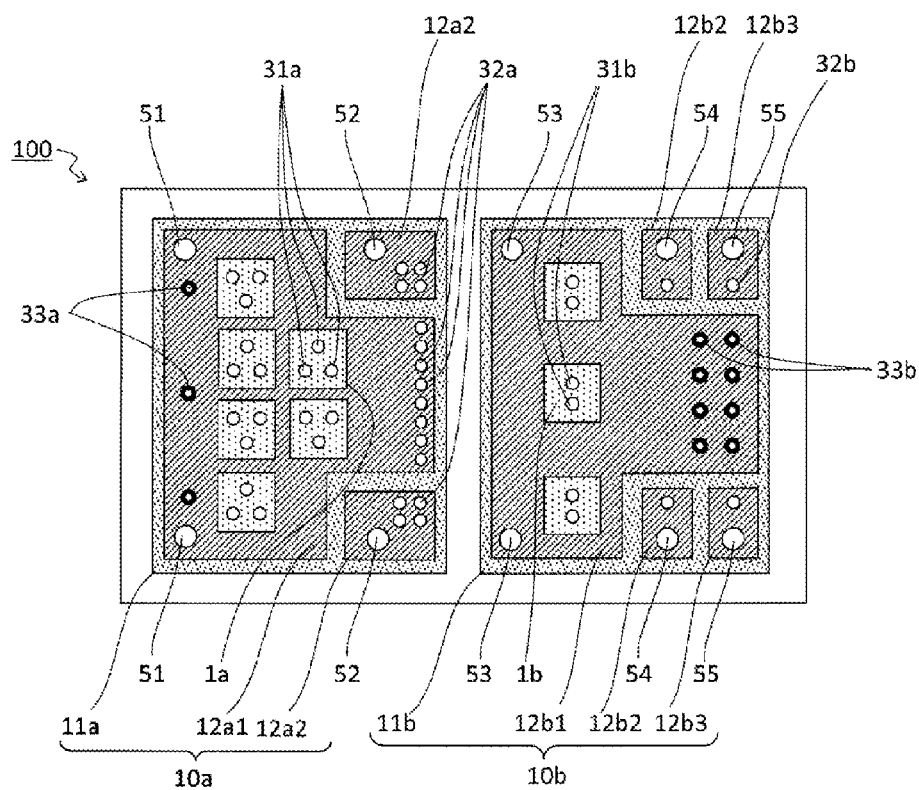
FIG. 1A is a schematic diagram showing an embodiment of a semiconductor device according to the present disclosure.
Figure 1B:
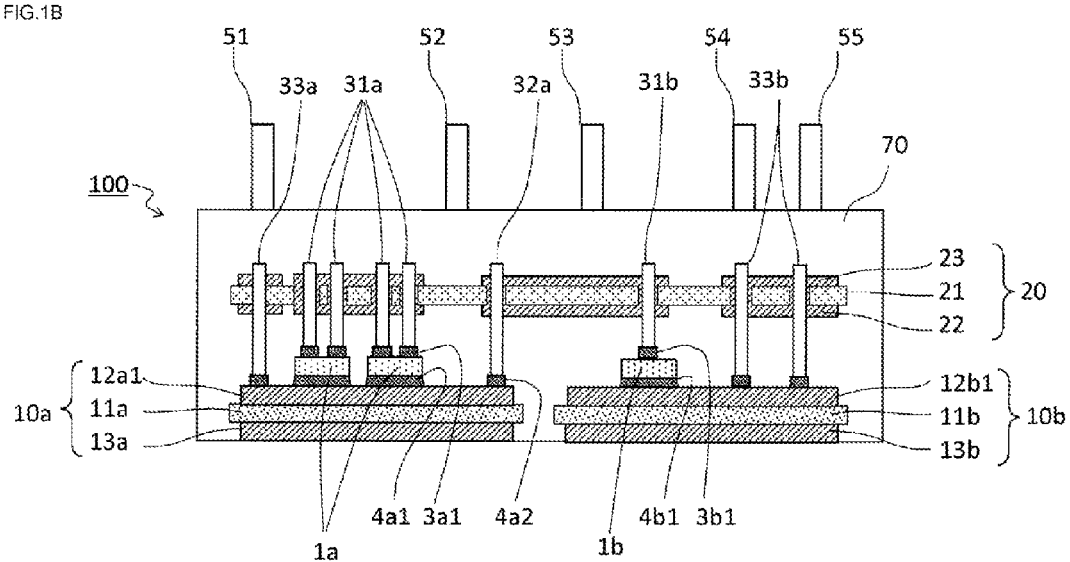
FIG. 1B is a cross-sectional diagram of FIG. 1A.

FIG. 1A is a plan view of a chopper control semiconductor device 100 according to the present disclosure, and FIG. 1B is a cross-sectional diagram thereof. FIG. 5 shows an equivalent circuit of the semiconductor device 100.

The semiconductor device 100 of the present disclosure has third-type conductive pins 33a, 33b that are fixed to the printed wiring board 20 and bonded to the surface metal layers 12a1, 12b1 of the insulated circuit board to prevent the printed wiring board 20 from tilting, wherein in the printed wiring board the third-type conductive pins 33a, 33b are electrically isolated from the wiring and independent of the electric circuits. The third-type conductive pins 33a, 33b are arranged according to the rules described hereinafter.

The semiconductor device 100, therefore, has an insulated circuit board 10a to which are bonded six MOS transistors 1a that are connected in parallel for the purpose of increasing the current capacity, an insulated circuit board 10b to which are bonded three diodes 1b that are connected in parallel for the purpose of increasing the current capacity, the printed wiring board 20 (not shown in the plan view), first-type conductive pins 31a that are fixed to the printed wiring board 20 and bonded to surface electrodes of the MOS transistors 1a, second-type conductive pins 32a that are fixed to the printed wiring board 20 and bonded to surface metal layers 12a1, 12a2 of the insulated circuit board 10a, the third-type conductive pins 33a that are fixed to the printed wiring board 20 and bonded to the surface metal layer 12a1 of the insulated circuit board 10a, first-type conductive pins 31b that are fixed to the printed wiring board 20 and bonded to surface electrodes of the diodes 1b, second-type conductive pins 32b that are fixed to the printed wiring board 20 and bonded to surface metal layers 12b2, 12b3 of the insulated circuit board 10b, the third-type conductive pins 33b that are fixed to the printed wiring board 20 and bonded to the surface metal layer 12b1 of the insulated circuit board 10b, external terminals 51 to 55, and thermosetting sealing resin 70 such as epoxy resin. It should be noted that the use of the thermosetting sealing resin 70 is not the only way to seal the semiconductor device; thus, a combination of a case and silicone resin can be selected as well.

The MOS transistors 1a are each a vertical N-channel MOSFET (Metal Oxide Semiconductor Field Effect Transistor) having a source electrode and a gate electrode on its front surface and a drain electrode on its rear surface. On the other hand, the diodes 1b are each a vertical Schottky barrier diode having an anode electrode on its front surface and a cathode electrode on its rear surface. The MOS transistors 1a and diodes 1b may be not the only semiconductor elements formed on a silicon substrate but also the semiconductor elements formed on a silicon carbide substrate.

The insulated circuit board 10a has an insulation board 11a, the metal layer 12a1, which is disposed on one of the principal surfaces of the insulation board 11a and to which the MOS transistors 1a are bonded with a bonding member 4a1 therebetween, metal layers 12a2 (two) to each of which the external terminal 52 is bonded, and a metal layer 13a that is disposed on the other principal surface of the insulation board 11a and can be connected to a cooler that is not shown.

The insulated circuit board 10b has an insulation board 11b, the metal layer 12b1, which is disposed on one of the principal surfaces of the insulation board 11b and to which the diodes 1b are bonded with a bonding member 4b1 therebetween, metal layers 12b2 (two) to each of which the external terminal 54 is bonded, metal layers 12b3 (two) to each of which the external terminal 55 is bonded, and a metal layer 13b that is disposed on the other principal surface of the insulation board 11b and can be connected to the cooler that is not shown.

As described above, the insulated circuit boards 10a, 10b are the circuit boards in each of which the metal layers are arranged on either side of the insulation board, wherein the metal layers disposed on the principal surfaces to which the semiconductor elements are bonded are divided into island regions in specific shapes that are electrically insulated, to configure the electric circuits, and wherein the other principal surfaces each configure a cooling surface to be connected to the cooler. The materials of the insulation boards are not particularly limited, and materials that are excellent in thermal conductivity and have low dielectric loss are favorably used. The materials of the metal layers, too, are not particularly limited and metals having low electrical resistance are favorably used. Specific examples include a direct bonding copper substrate created by bonding a copper sheet directly to ceramics such as alumina, aluminum nitride or silicon nitride, and an active metal brazed copper substrate created by bonding a copper sheet to the ceramics with a brazing filler metal.

The materials of the bonding members 4a1, 4b1 are not particularly limited, and for example, lead-free solder, a nano-silver paste (paste containing silver nanoparticles) or the like can be used.

The printed wiring board 20 is configured by an insulation board 21, a metal layer 22 that is disposed on one of the principal surfaces of the insulation board 21, faces the insulated circuit boards 10a and 10b and is wired into an electric circuit, and a metal layer 23 that is disposed on the other principal surface of the insulation board 21 and wired into an electric circuit, wherein the metal layers 22 and 23 are electrically connected to each other by via holes that pass through the printed wiring board 20 and have inner circumferential surfaces thereof conductively plated. Here, the insulation board 21 may be made of ceramics such as alumina, aluminum nitride or silicon nitride or may be a resin product made of epoxy resin or the like containing fiberglass.

The conductive pins 31a, 31b, 32a, 33a, 33b are in a cylindrical or prismatic shape. The ends thereof at one side are press-fitted to the via holes provided in the printed wiring board 20, and fixed to the printed wiring board 20 using a bonding member so as to be unremovable. For instance, the inner circumferential surfaces of the via holes of the printed wiring board 20 or the surfaces of the press-fitted portions of the conductive pins can be plated with Sn, SnAg-based solder, SnBi-based solder, SnSb-based solder, SnCu-based solder, SnIn-based solder or the like, and then the conductive pins can be press-fitted and thereafter heated to the melting temperature, to perform fused bonding of the conductive pins.

The external terminals 51 through 55 have ends at one side fixed to the insulated circuit board 10a or 10b, and extend to the outside of the sealing resin 70 through throughholes or cutouts provided in the printed wiring board 20, in such a manner as to not come into contact with the printed wiring board 20. Therefore, the external terminals 51 through 55 are configured to not affect the posture of the printed wiring board 20.

According to a first arrangement rule for the third-type conductive pins in the semiconductor device of the present disclosure, in each of adjacent island regions the third-type conductive pins are arranged at the same positions as, or positions farther than, the first-type conductive pins or second-type conductive pins that are arranged at the positions farthest from the sides that are in contact with the gap between the island regions.

According to this rule, the third-type conductive pins are arranged far away from the rotation fulcrum of the printed wiring board so as to be able to apply large moment of force to the printed wiring board. Therefore, even when the number of third-type conductive pins is low, the printed wiring board can easily be prevented from tilting. In addition, in the printed wiring board, the third-type conductive pins are electrically isolated from the wiring and independent of the electric circuits. For this reason, although the third-type conductive pins can be arranged on the insulated circuit boards in a less restrictive manner, the first arrangement rule has the advantage that the third-type conductive pins can be arranged more freely in the outer edge regions located away from the gap between the metal layers.

According to a second arrangement rule for the third-type conductive pins, of the island regions in which the third-type conductive pins are to be arranged, more of the third-type conductive pins are arranged in the island region that has a lower total number of the connected first-type conductive pins and a lower total number of the connected second-type conductive pins.

This rule can even out the moment of the force acting on the printed wiring board, easily preventing the printed wiring board from tilting.

The arrangement rules for arranging the third-type conductive pins on the metal layer 12a1 and the metal layer 12b1 drawn with solid lines are described hereinafter specifically with reference to FIG. 2. In this example, note that the metal layers 12a2, 12b2, 12b3 drawn with broken lines have small areas and no extra space and therefore do not have the third-type conductive pins arranged thereon.

The "sides that are in contact with the gap between the island regions" described in the first arrangement rule indicate sides La, Lb that are closest to each other among the sides configuring the gap between the metal layer 12a1 forming an island region and the metal layer 12b1 forming another island region.

The metal layer 12a1 has a total of twenty-six conductive pins arranged thereon, i.e., eighteen first-type conductive pins 31a and eight second-type conductive pins 32a. Of these twenty-six conductive pins, four first-type conductive pins 31a1 are arranged at positions farthest from the side La by a distance x1. Then, according to the first arrangement rule, three third-type conductive pins 33a are arranged at positions away from the side La by a distance y1 longer than the distance x1.

In the metal layer 12b1, six first-type conductive pins 31b are arranged at positions farthest from the side Lb by a distance x2. Then, according to the first arrangement rule, a total of eight third-type conductive pins 33b are arranged, i.e., four at positions away from the side Lb by a distance y2 longer than the distance x2, and four at positions away from the side Lb by a distance z2.

Prior to arranging the third-type conductive pins as described above, a total of twenty-six conductive pins are arranged on the metal layer 12a1 and a total of six conductive pins are arranged on the metal layer 12b1. The difference between the total numbers is twenty. After the third-type conductive pins are arranged, a total of twenty-nine conductive pins are arranged on the metal layer 12a1 and a total of fourteen conductive pins are arranged on the metal layer 12b1. The difference between the total numbers is then fifteen.

The positions of the eight second-type conductive pins 32a1 arranged adjacent to the side La correspond to the rotation fulcrum about which the printed wiring board 20 tilts. Therefore, these second-type conductive pins 32a1 do not contribute to the application of the moment of force and thus can be eliminated from the twenty-nine conductive pins arranged on the metal layer 12a1, resulting in practically a configuration equivalent to the one in which twenty-one conductive pins are arranged on the metal layer 12a1 and a total of fourteen conductive pins are arranged on the metal layer 12b1, with the difference between these numbers being reduced to seven.

Given that the total of eight second-type conductive pins on the two metal layers 12a2 are positioned in the vicinity of the fulcrum and are therefore eliminated and that the total of two second-type conductive pins on the two metal layers 12b2 and the total of two second-type conductive pins on the two metal layers 12b3 apply the moment of force, the difference in the number of conductive pins between the metal layer 12a1 and the metal layer 12b1 is practically three.

Arranging the third-type conductive pins in this manner can reduce the difference in the imbalance of the moment of force, reducing the tilt of the printed wiring board to the extent that does not affect the non-defective product ratio.

Note that the insulated circuit boards 10a and 10b do not have to be divided into two, and the insulation boards 11a and 11b may be integrated, in which the metal layers 12a1, 12a2, 12b1, 12b2 and 12b3 may be formed on one of the surfaces and the metal layers 13a and 13b on the other surface.

The MOS transistors 1a of the chopper control semiconductor device 100 may each be an IGBT (Insulated Gate Bipolar Transistor).

In addition, the semiconductor of the present disclosure does not have to be a chopper control semiconductor device and may be, for example, a bridge circuit in which an IGBT (switching element) and SBD (freewheeling diode) are mounted on the metal layer 12a1 as the semiconductor elements and an IGBT and SBD are mounted on the metal layer 12b1 as the semiconductor elements, an inverter control semiconductor device, or the like.

Second Embodiment

Figure 3:
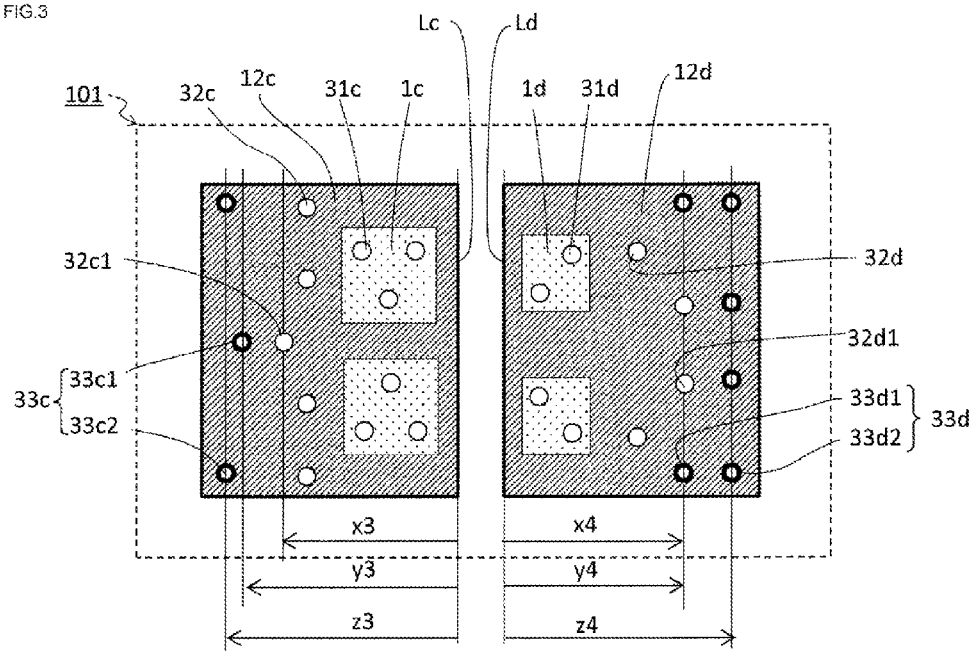
FIG. 3 is a schematic diagram showing another embodiment of the semiconductor device according to the present disclosure.

Another embodiment of the semiconductor device according to the present disclosure is now described. FIG. 3 shows a plan view of a semiconductor device 101. For the purpose of clear illustration, the diagram does not show any of the insulation boards, printed wiring board, external terminals, and sealing resin of the insulated circuit boards, but only shows semiconductor elements 1c, 1d, metal layers 12c, 12d of the insulated circuit boards, first-type conductive pins 31c, 31d, second-type conductive pins 32c1, 32d1, and third-type conductive pins 33c1, 33d1, which are all necessary for explaining the arrangement of the conductive pins. The metal layer 12c and the metal layer 12d each configure a rectangular island region and are adjacent to each other, wherein the sides thereof that are in contact with the gap between these two island regions are taken as a side Lc and a side Ld respectively.

The metal layer 12c has a total of eleven conductive pins arranged thereon, i.e., six first-type conductive pins 31c and five second-type conductive pins 32c1. Of these eleven conductive pins, the conductive pin located farthest from the side Lc is one second-type conductive pin 32c1 which is arranged away from the side Lc by a distance x3. Then, according to the first arrangement rule, a total of three third-type conductive pins 33c are arranged, i.e., one at a position that is away from the side Lc by a distance y3 longer than the distance x3, and two at positions away from the side Lc by a distance z3 longer than the distance y3.

The metal layer 12d has a total of eight conductive pins arranged thereon, i.e., four first-type conductive pins 31d and four second-type conductive pins 32d1. Of these first-type and second-type conductive pins on the metal layer 12d, the conductive pins located farthest from the side Ld are two second-type conductive pins 32d1 which are arranged away from the side Ld by a distance x4. Then, according to the first arrangement rule, a total of six third-type conductive pins 33d are arranged, i.e., two at positions away from the side Ld by a distance y4 equivalent to the distance x4, and four at positions away from the side Ld by a distance z4 longer than the distance x4.

Prior to arranging the third-type conductive pins as described above, a total of eleven conductive pins are arranged on the metal layer 12c and a total of eight conductive pins are arranged on the metal layer 12d. The difference between the total numbers is three. After the third-type conductive pins are arranged, a total of fourteen conductive pins are arranged on the metal layer 12c and a total of fourteen conductive pins are arranged on the metal layer 12d, i.e., the same number of conductive pins are arranged on the metal layers. Consequently, the moments of force applied become balanced so that the printed wiring board does not tilt, improving the non-defective product ratio.

Third Embodiment

Figure 4:
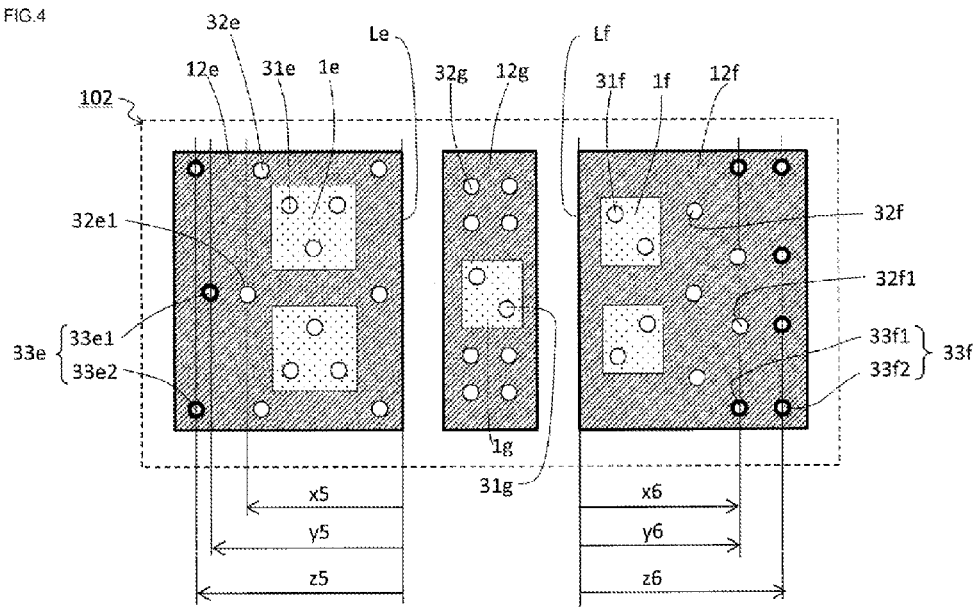
FIG. 4 is a schematic diagram showing yet another embodiment of the semiconductor device according to the present disclosure.

Another embodiment of the semiconductor device according to the present disclosure is now described. FIG. 4 shows a plan view of a semiconductor device 102. For the purpose of clear illustration, the diagram does not show any of the insulation boards, printed wiring board, external terminals, sealing resin, and case of the insulated circuit boards, but only shows semiconductor elements 1e, 1f, 1g, metal layers 12e, 12f, 12g of the insulated circuit boards, first-type conductive pins 31e, 31f, 31g, second-type conductive pins 32e, 32f, 32g, and third-type conductive pins 33e, 33f, which are all necessary for explaining the arrangement of the conductive pins. The metal layers 12e, 12f, 12g each configure a rectangular island region and are arranged horizontally. Because the first-type conductive pins 31g and second-type conductive pins 32g on the metal layer 12g located in the middle are the pins acting as or adjacent to the fulcrum about which a printed wiring board, not shown, tilts, these conductive pins hardly contribute to the application of the moment of force. Therefore, without taking these conductive pins into consideration, the third-type conductive pins may be arranged in such a manner that the moment of force applied by the conductive pins arranged on the metal layer 12e and the moment of force applied by the conductive pins arranged on the metal layer 12f are balanced.

The side of the metal layer 12e that is in contact with the gap between the metal layer 12e and the metal layer 12g is taken as a side Le, and the side of the metal layer 12f that is in contact with the gap between the metal layer 12f and the metal layer 12g is taken as a side Lf.

The metal layer 12e has a total of twelve conductive pins arranged thereon, i.e., six first-type conductive pins 31e and six second-type conductive pins 32e. Of these twelve conductive pins, the conductive pin located farthest from the side Le is one second-type conductive pin 32e1 which is arranged away from the side Le by a distance x5. Then, according to the first arrangement rule, a total of three third-type conductive pins 33e are arranged, i.e., one at a position that is away from the side Le by a distance y5 longer than the distance x5, and two at positions away from the side Le by a distance z5 longer than the distance y5.

The metal layer 12f has a total of nine conductive pins arranged thereon, i.e., four first-type conductive pins 31f and five second-type conductive pins 32f. Of these first-type and second-type conductive pins on the metal layer 12f, the conductive pins located farthest from the side Lf are two second-type conductive pins 32f1 which are arranged away from the side Lf by a distance x6. Then, according to the first arrangement rule, a total of six third-type conductive pins 33f are arranged, i.e., two at positions away from the side Lf by a distance y6 equivalent to the distance x6, and four at positions away from the side Lf by a distance z6 longer than the distance x6.

Prior to arranging the third-type conductive pins as described above, a total of twelve conductive pins are arranged on the metal layer 12e and a total of nine conductive pins are arranged on the metal layer 12f. The difference between the total numbers is three. After the third-type conductive pins are arranged, a total of fifteen conductive pins are arranged on the metal layer 12e and a total of fifteen conductive pins are arranged on the metal layer 12f, i.e., the same number of conductive pins are arranged on the metal layers. Consequently, the moments of force applied become balanced so that the printed wiring board does not tilt, improving the non-defective product ratio.

Although embodiments have been shown and described, it would be appreciated by those skilled in the art that changes may be made in the embodiments without departing from the principles and spirit of the invention, the scope of which is defined in the claims and their equivalents.

Any identification in this disclosure of problems, deficiencies, or other characterizations of any product or method of the related art does not imply or admit that such problems, deficiencies, or other characterizations were known in the prior art even if the product or method itself was known in the prior art.

Reference signs and numerals are as follows:
1a MOS transistor (semiconductor element)
1b Diode (semiconductor element)
1c, 1d, 1e, 1f, 1g Semiconductor element
3a1, 3b1, 4a1, 4a2, 4b1 Bonding member
10a, 10b Insulated circuit board
11a, 11b Insulation board
12a, 12a1, 12a2, 12b, 12b1, 12b2, 12b3, 12c, 12d, 12e, 12f, 12g Metal layer to which semiconductor element is bonded
13a, 13b Metal layer bonded to cooler
20 Printed wiring board
21 Insulation board of printed wiring board
22, 23 Metal layer of printed wiring board
31a, 31b First-type conductive pin
32a, 32b Second-type conductive pin 33a, 33b Third-type conductive pin
51, 52, 53, 54, 55 External terminal
70 Sealing resin
100, 101, 102, 200 Semiconductor device
F Poor bonding
P Fulcrum
La, Lb, Lc, Ld, Le, Lf Side in contact with gap between island regions

What is claimed is:

1. A semiconductor device, comprising:
   an insulated circuit board having
      an insulating substrate,
      a first metal layer disposed on a first surface of the insulating substrate and divided into a plurality of island regions, and
      a second metal layer disposed on a second surface of the insulating substrate opposite to the first surface;
   at least one semiconductor element bonded to the first metal layer;
   a printed wiring board facing the first metal layer and extended over the plurality of island regions;
   first conductive pins each having one end fixed to the printed wiring board and another end soldered to a surface electrode of the at least one semiconductor element;
   second conductive pins each having one end fixed to the printed wiring board and another end soldered to the first metal layer; and
   third conductive pins each having one end fixed to the printed wiring board and another end soldered to the first metal layer, the third conductive pins being electrically isolated from an electric circuit of the printed wiring board,
   wherein each of a first island region and a second island region of the plurality of island regions has at least one of the third conductive pins arranged thereon,
   the first and the second island regions are distanced from each other by a gap between the first and the second island regions, and
   for each of the first and second of the island regions, each of the third conductive pins thereon are connected to the first metal layer at a position distanced from the gap at least as far as a distance, from the gap, of each of the first conductive pins and the second conductive pins thereon.

2. The semiconductor device according to claim 1, wherein among the first and second of the island regions,
   one of the first and second of the island regions has a higher number of the third conductive pins thereon, and
   the other of the first and second of the island regions has a higher total number of the first conductive pins and second conductive pins thereon.

3. The semiconductor device according to claim 1, wherein the first island region is adjacent to the second island region.

4. The semiconductor device according to claim 3 wherein
   the plurality of island regions further includes a first island region, a second island region, and a third island region, and
   the second island region is arranged adjacent to and between the first island region and the third island region.

5. The semiconductor device according to claim 1, wherein
   the at least one semiconductor element includes a transistor having a gate electrode and a source electrode, and
   the gate electrode and the source electrode are each soldered to the another end of one of the first conducive pins.

6. The semiconductor device according to claim 1, wherein each of the third conductive pins is electrically isolated from all electric circuits of the printed wiring board.

7. The semiconductor device according to claim 2, wherein each of the third conductive pins is electrically isolated from all electric circuits of the printed wiring board.

8. The semiconductor device according to claim 3, wherein each of the third conductive pins is electrically isolated from all electric circuits of the printed wiring board.

9. The semiconductor device according to claim 4, wherein each of the third conductive pins is electrically isolated from all electric circuits of the printed wiring board.

10. The semiconductor device according to claim 5, wherein each of the third conductive pins is electrically isolated from all electric circuits of the printed wiring board.

* * * * *